United States Patent [19]

Kemmer et al.

[11] Patent Number: 4,982,253
[45] Date of Patent: Jan. 1, 1991

[54] SEMICONDUCTOR CHARGE STORAGE ELEMENT AND METHOD OF OPERATING SUCH A STORAGE ELEMENT

[75] Inventors: Josef Kemmer, Haimhausen; Gerhard Lutz, Threse Giehse Allee 23, 8000 Munich 83, both of Fed. Rep. of Germany

[73] Assignees: Messerschmitt-Boelkow-Blohm GmbH; Gerhard Lutz, both of Munich, Fed. Rep. of Germany

[21] Appl. No.: 189,633

[22] Filed: May 3, 1988

[30] Foreign Application Priority Data

May 11, 1987 [DE] Fed. Rep. of Germany ....... 3715675

[51] Int. Cl.⁵ .................... H01L 29/78; H01L 29/74
[52] U.S. Cl. ......................................... 357/24; 357/38
[58] Field of Search ............ 357/38, 24, 24 LR, 24 M

[56] References Cited

U.S. PATENT DOCUMENTS

| | | | |
|---|---|---|---|
| 3,995,107 | 11/1976 | Waywood | 178/7.1 |
| 4,051,505 | 9/1977 | Krambeck et al. | 357/24 |
| 4,262,297 | 4/1981 | Partridge | 357/24 |
| 4,559,549 | 12/1985 | Roberts et al. | 357/24 |
| 4,591,917 | 5/1986 | Suzuki | 357/24 |

FOREIGN PATENT DOCUMENTS 2009500 6/1979 United Kingdom .................. 357/24

OTHER PUBLICATIONS

New Detector Concepts, by J. Kemmer et al, pp. 365–377, Nuclear Instruments and Methods in Physics Research A253 (1987).

Primary Examiner—Rolf Hille
Assistant Examiner—D. M. Ostrowski
Attorney, Agent, or Firm—W. G. Fasse; D. H. Kane, Jr.

[57] ABSTRACT

In a semiconductor element having a semiconductor body, an electrode structure is arranged on at least one major surface of the element for storing charge carriers of at least one conductivity in cells formed by the electrode structure. Control electrodes which are at least partially enclosed in the semiconductor body are arranged in at least one plane essentially parallel to the major surface of the semiconductor body. The control electrodes similarly enable charge carriers to be stored in defined cells. The control electrodes stored also make it possible to shift stored charges from one cell to another, whereby at least two independent charge images can be stored in a three-dimensionally arranged storage cell pattern.

12 Claims, 6 Drawing Sheets

SEMICONDUCTOR CHARGE STORAGE ELEMENT AND METHOD OF OPERATING SUCH A STORAGE ELEMENT

FIELD OF THE INVENTION

The invention relates to a semiconductor element with a semiconductor body which is made of a material having a first conductivity and which includes a surface electrode structure on at least one major surface. The electrode structure allows storing of charge carriers of at least one conductivity type in cells in the semiconductor body.

DESCRIPTION OF THE PRIOR ART

Semiconductor elements of the above described general type are known in the prior art. Examples of such elements include CCDs and matrix pixel arrays of the type described in "Nucl. Instr. & Meth."A 253 (1987) 365.

It is a typical characteristic of this type of element that only one charge image can be stored and then read out. Recording or storing one or more new charge images would alter the original stored charge image. Thus, a new charge image can only be stored after the previous charge image has been completely read out or cleared or erased.

OBJECTS OF THE INVENTION

In view of the foregoing it is the aim of the invention to achieve the following objects singly or in combination:

to develop a semiconductor element in which charge carriers can be stored in cells to form a charge image, whereby at least two independent charge images may be stored essentially simultaneously;

to allow a charge image to be moved or transferred in a direction perpendicular to the major surface of such a semiconductor element by providing control electrodes in the semiconductor body thereof;

to allow a charge image to be moved or shifted in a direction parallel to the major surface of such a semiconductor element;

to form a semiconductor element in which storage cells for charge carriers are arranged in a lattice type pattern for moving charge carriers in the three directions of space within the element; and to allow a second charge image or several charge images to be received and/or stored while a previous first charge image is being read out.

SUMMARY OF THE INVENTION

These objects have been achieved in a semiconductor element of the above described type according to the invention, wherein at least partially enclosed control electrodes are arranged in the semiconductor body at least in a plane parallel to the major surface thereof. The control electrodes may have a strip arrangement or a grid arrangement. These control electrodes enable the storing of charge carriers to form a second charge image in addition to the charge image stored by the surface electrode structure. Control electrodes may be provided in several planes arranged one above another to allow charges to be stored in storage elements arranged three-dimensionally, e.g. in a lattice type pattern, whereby a charge transfer is possible in a direction perpendicular to the major surface of the semiconductor body, and whereby charge carriers may be shifted within the semiconductor body in planes parallel to the major surface thereof. The shifting and transferring of charge carriers can be further enhanced by appropriately selectively doping the semiconductor body and the electrode regions. In different embodiments, the semiconductor element according to the invention may be used as a charge store for storing, reading out, and measuring the charges of a charge image, as a radiation detector, or even as a three-dimensional analog or digital storage memory, or as a combination of these functions.

Thus, it is possible according to the invention to store simultaneously at least two different charge images because the control electrodes provided in at least one plane parallel to the major surface allow the charge image to be transferred in a direction perpendicular to the major surface. A charge image may be transferred from a first storage plane within the semiconductor body to a second storage plane relative to the surface electrode structure where the image may be read out while another charge image is being stored in the first storage plane.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
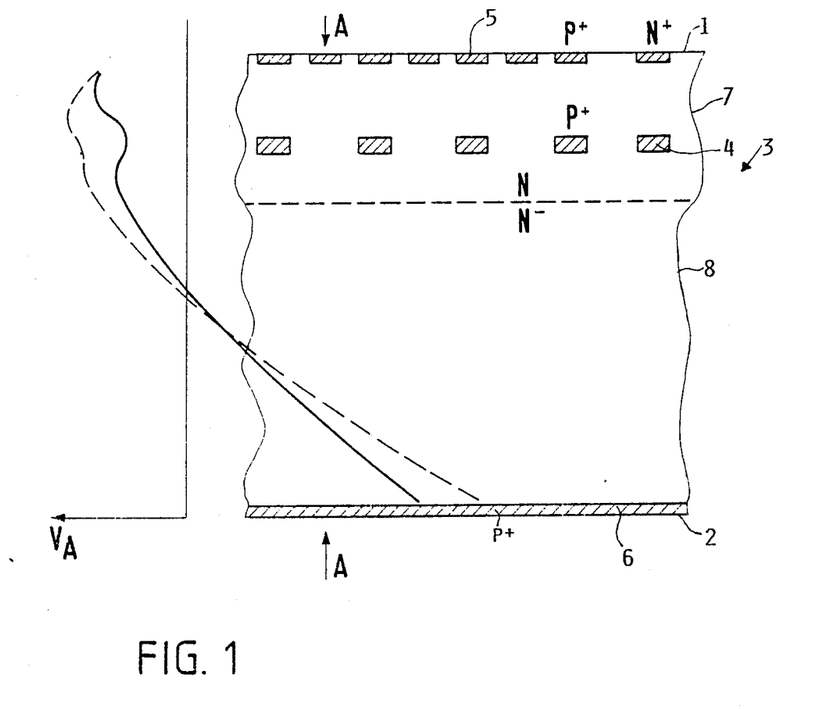
FIG. 1 is a cross-section of a first embodiment of a semiconductor element according to the invention, with a graph of the electric potential characteristic through the element.

FIG. 1 shows a semiconductor structure according to the invention with which a second charge image may be received and/or stored while a previous charge image is being read out. This structure may be used as a radiation detector.

In the example embodiment shown in FIG. 1, the upper major surface 1 has the general structure of a P-N CCD as described, for example in the above mentioned article in "Nucl. Instr. & Meth."A 253 (1987) 386". A $p^+$-type surface electrode 5 is arranged with, for example, a strip- or grid-shape on the surface 1 of the semiconductor body. A highly doped $p^+$ grid 4 is arranged within the N-doped semiconductor body 3 on a plane parallel to the major surface 1 to form a control electrode. A control voltage may be externally applied to the grid 4. The lower major surface 2 is provided with, for example, a surfacially covering or full-surface $p^+$-type electrode 6.

Voltages may be applied to the $p^+$-type electrodes 5 and 6 of the upper and lower major surfaces 1 and 2 respectively, and to the grid electrode 4, in such a manner that for a fully depleted base region, either: (a) potential maxima are created only between the grid plane 4 and the upper major surface 1; or (b) further periodically arranged potential maxima, in addition to the maxima described in (a), are created slightly below the grid plane 4. Thus, storage cells for charge carriers are formed directly in the semiconductor body 3.

In case (a), the arrangement could be driven in a manner similar to a normal majority charge carrier CCD, and the grid electrode would serve essentially no purpose. However, in case (b), if charge carriers are created in the volume below the grid plane, for example by incident ionizing radiation, then the electrons, for example, will be collected and retained in the potential maxima below the grid electrode. Then, by varying the potentials applied to the electrodes, the electrons or other charge carriers can be transferred into the region between the grid electrode 4 and the upper major surface 1. This may be achieved, for example, by increasing the grid potential and/or reducing the potential of the lower surface electrode 6, whereby a potential configuration as in case (a) is achieved. The voltage distributions of case (b) and case (a) are shown in the left portion of FIG. 1 by solid and dashed lines respectively.

Thereafter, reading-out the transferred charge image can be carried out by means of the CCD structure at the upper major surface 1. Simultaneously, a new charge image may be received and stored. In the example embodiment shown in FIG. 1, an upper N region 7 of the base body 3 is more heavily doped than the remaining lower N$^-$ region 8. This arrangement has the advantage that sufficiently defined potential maxima are already formed at considerably smaller potential differences between the two major planes than would be possible with a uniform doping.

The grid electrodes 4 may have a grid-shape or a strip-shape. A grid-shaped embodiment has the advantage of achieving a two-dimensional arrangement of potential maxima under the grid plane.

For a strip-shaped embodiment, additional measures must be taken to achieve such a two-dimensional potential maxima arrangement and to prevent charge carriers from "leaking" in the lengthwise direction of the strips. For example, the doping density could be varied in a manner similar to "channel stops" in CCDs, or the electrode strips could be made thicker periodically along their length for achieving the desired arrangement of potential maxima.

Figure 2:
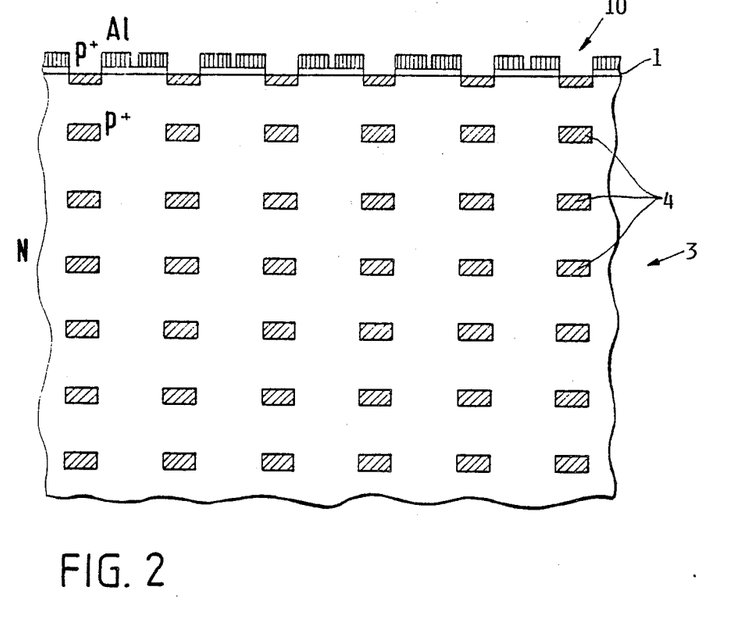
FIG. 2 is a view similar to that of FIG. 1, but of a modified embodiment for storing several charge images.

In the example embodiment shown in FIG. 2, several charge images can be stored in several planes parallel to the major surface 1. Thus, a three-dimensional storage device is obtained. Here, the upper major surface 1 is embodied as a "random access pixel device" 10. A plurality of grid electrodes 4 is arranged within the base body 3, whereby it is possible to achieve a configuration of the above described periodically arranged potential maxima in several planes on top of one another. In this arrangement the potential maxima are distributed three-dimensionally.

Figure 3:
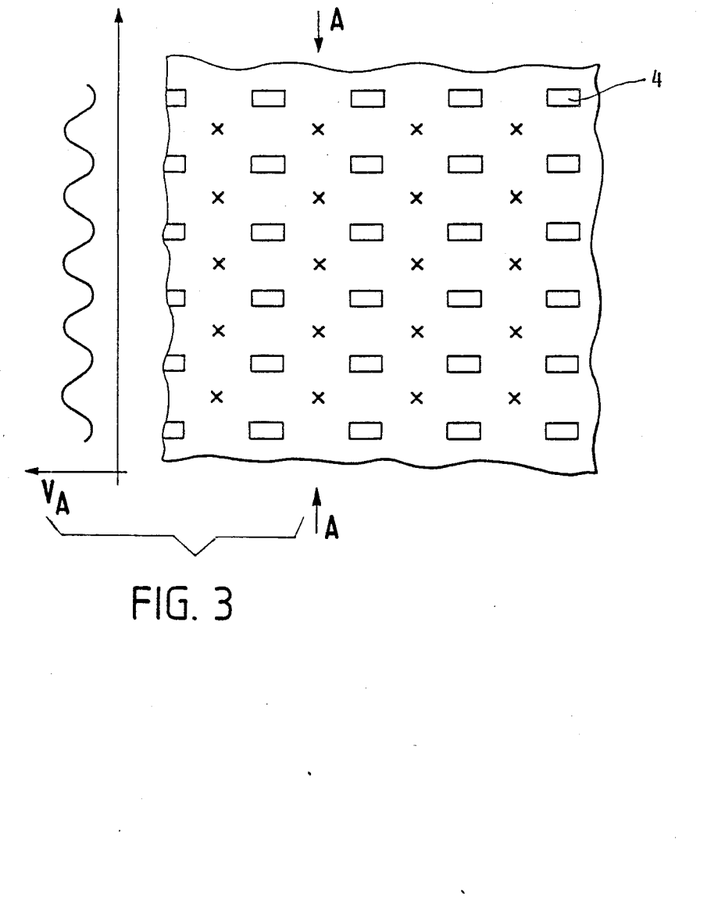
FIG. 3 is a cross-section of a semiconductor element with electric potential peaks between all electrode planes, and showing a plot of the potential characteristic along the line A—A.

Such an arrangement is possible with several variations. For example, if all of the grid electrodes 4 are at the same potential, then potential maxima x will be produced as shown in FIG. 3 respectively on the mid-planes between pairs of grid electrodes 4. In the left portion of FIG. 3, the potential characteristic is shown for a completely depleted base body along the section line A—A passing through potential maxima in a direction perpendicular to the major surface plane.

Figure 4:
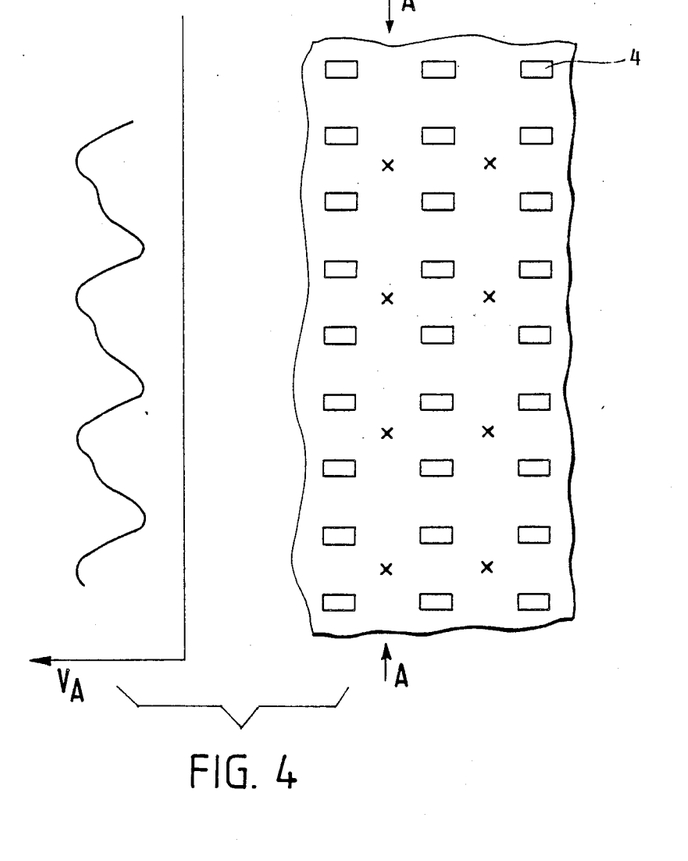
FIG. 4 is a view similar to that of FIG. 3, but with potential peaks between every second electrode plane pair.
Figure 5:
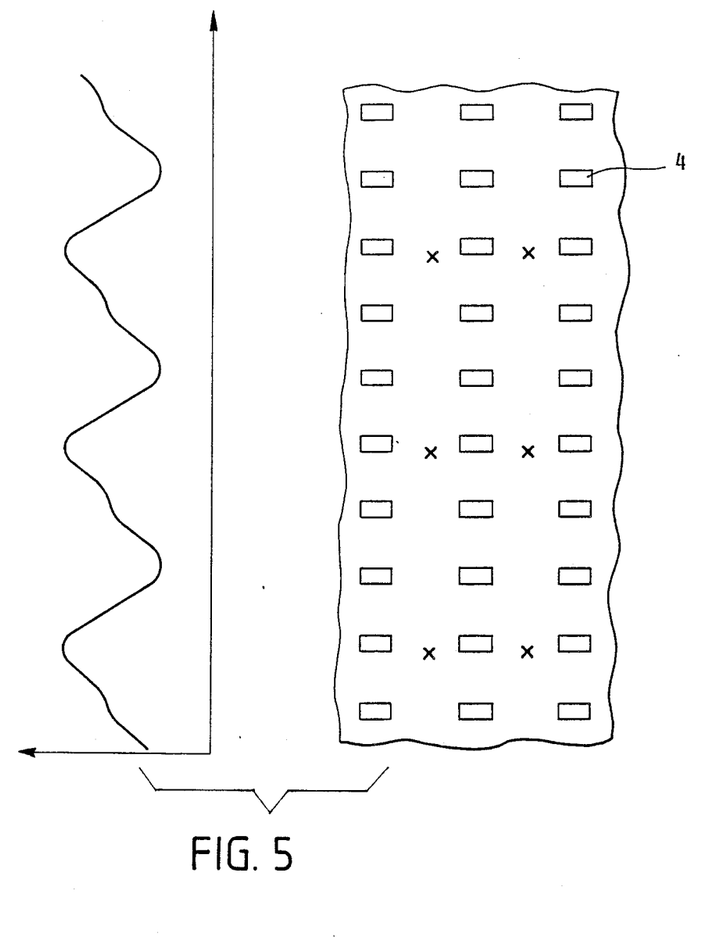
FIG. 5 is a view similar to that of FIG. 3, but with potential peaks associated with every third electrode plane.

It is also possible to apply different voltages to the separate grid electrodes 4, for example in such a manner that potential maxima x are only produced between every second pair of grid electrodes as shown in FIG. 4, or associated with every third grid electrode as shown in FIG. 5. The potential distribution shown in FIG. 5 is similar to that of a three-phase CCD, however in a direction perpendicular to the major surface instead of parallel thereto as would be typical. In FIGS. 4 and 5, the left portion of the figure again depicts the voltage distribution along the section line A—A.

The potential maxima arranged in a three-dimensional lattice structure as described above can be used for analog charge storing. Various possibilities exist for transferring or shifting, in a direction perpendicular to the major surface, a charge image respectively stored in one plane which is essentially parallel to the major surface. For example, starting with the configuration as shown in FIG. 5, that is, with charge storage in planes spaced three grid electrodes apart, the charge transfer may be carried out in a manner analogous to that of a three-phase CCD, but in a vertical direction instead of a horizontal direction.

Alternatively, starting with the configuration as shown in FIG. 4, with charge storage in planes spaced two grid electrodes apart, the charge transfer may be carried out analogously to a two-phase CCD, if a potential gradient has been formed in a direction perpendicular to the major surface respectively between adjacent grid planes by means of a variation of the doping concentration of the base body. This can be achieved relatively simply for an epitaxial construction of the structure. As is also true for the above described case, the recommended method of operation achieves a simultaneous shifting or transfer of all storage charge images in a direction perpendicular to the major surface, however in this case the shifting direction is fixed by the built-in doping gradient.

As a further alternative, the embodiment of FIG. 3 is also suitable for storing charge images and transferring charges in a direction perpendicular to the major surface. This embodiment is characterized by an increased number of simultaneously storable charge images relative to the embodiments of FIGS. 4 and 5 with the same total number of grid electrodes. However, the charge transfer is slower and more complicated, because a respective storage plane must be cleared or emptied before the charge image content of a neighboring storage plane can be transferred there. The shifting or transfer of all storage charge images by one level, that is to say the transfer of each image to the adjacent upper storage plane, can only be carried out one image at a time in a stepwise manner beginning with the uppermost image.

With, for example, a strip-shape arrangement of the grid electrodes, so that several separate electrode strips from each grid electrode plane parallel to the major surface, it is possible to set each electrode strip to a different voltage potential. Thus, it is additionally possible to achieve any desired charge shifting in a direction parallel to the major surface in any one, several, or all of the storage planes. This can occur in an analogous manner as the above described CCD-like motion in the perpendicular direction. Then, for example, every third possible potential maximum in the parallel direction is used as a charge storage location, just as described above for the perpendicular direction in the manner of operation of a three-phase CCD. As mentioned above, for a strip-shaped electrode structure, it is necessary to provide additional measures to prevent the dissipating flow of charge carriers in the lengthwise direction of the strip electrodes. This can be achieved by providing so-called channel stops or by periodically widening the strip electrodes along their length. Alternatively, the strip electrodes of adjacent grid electrode planes may be arranged in crossed directions, so that the strips of each electrode plane extend at an angle, for example essentially perpendicularly relative to the electrode strips of adjacent parallel planes. With such an arrangement, it is possible to control the charge image transfer or shifting not only in a direction perpendicular to the major surface, but also in at least two or more motion directions parallel to the major surface, simply by properly selecting and driving appropriate electrode strips.

The semiconductor element according to the invention can be used as a radiation detector or sensor with the capability to store several chronologically successive images which are received as radiation patterns or images. It is also possible to add or subtract various combinations of several images, or to compare received images with a previously recorded reference image by means of the semiconductor element of the invention. The capability of image subtraction is achieved, for example, if the major surface of the element is embodied as a random access pixel device, however, in a manner that a respective pair of neighboring DEPMOS transistors forms the inputs of a differential amplifier. The DEPMOS transistor on which the pixel device is based, and corresponding circuitry, are described in the above mentioned publication "Nucl. Instr. & Meth."A 253 (1987) 356. The reference image and the image to be compared must then be deposited respectively under the other gate of the DEPMOS transistor. This can be achieved by appropriately shifting the images parallel to the major surface as described above. It should be noted that the comparison image does not have to be received or recorded optically as a radiation image. Instead, the image could be generated by coupling-in signals through the electrodes, as can be done for CCDs.

Figure 6:
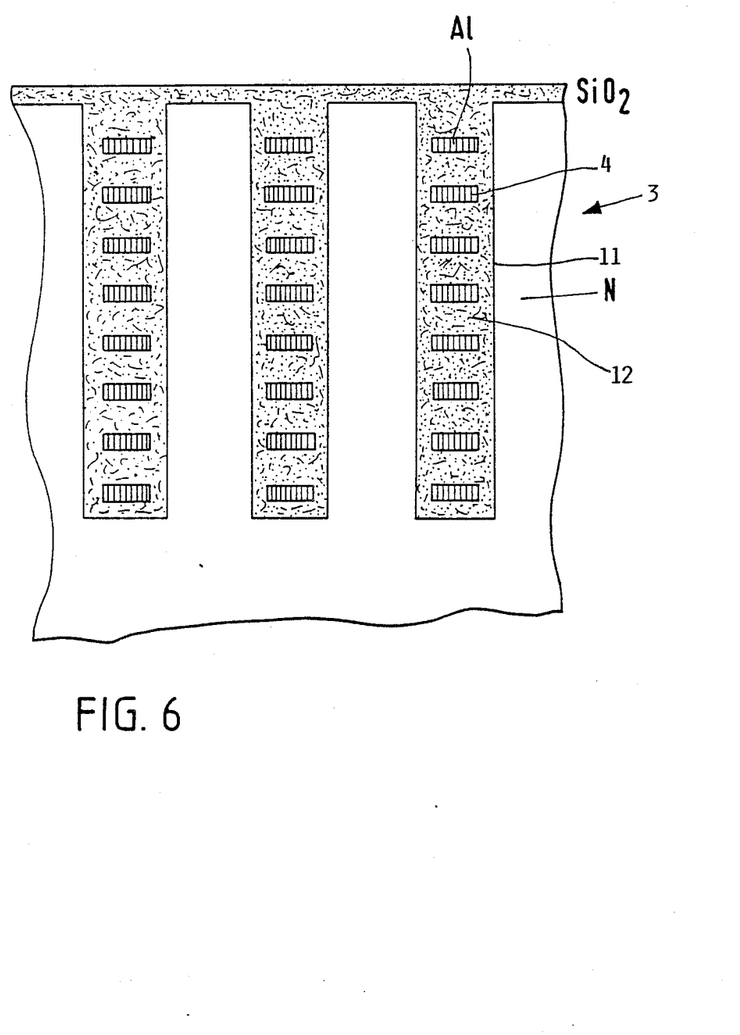
FIG. 6 is a cross-section of a semiconductor element with a modified electrode structure.

In the above described example embodiments, the grids were formed from semiconductor material doped opposite the doping of the base region. However, problems may arise due to the electrical resistance of the grid electrode elements if high speed operation is desired. In these cases it is advantageous to use electrode elements having a high conductivity, such as, for example, metallic electrodes or electrodes of any other highly conducting materials. Metallic electrodes must be electrically insulated from the semiconductor body. An embodiment of the invention including insulated metal electrodes is shown in FIG. 6. The grid electrodes 4, which are made of aluminum for example, are embedded in deep grooves 11 set into the semiconductor body 3. The grooves 11 are filled with an electrically insulating material 12 for example SiO$_2$, which surrounds and insulates the electrodes 4 from the semiconductor 3 and from each other.

In the above described uses of the semiconductor element of the invention as a detector, the basic assumption has been made that essentially the unstructured major portion of the base body is used for radiation detection, while the structured portion containing the grid electrodes is used as a storage element for storing the detected radiation images. This is especially applicable for long range or deeply penetrating radiation. For short range radiation, such as visible light for example, irradiation from the structured side of the semiconductor element is also possible. This would be a possibility, among other things, of introducing a comparison image from the side of the semiconductor opposite the normal image.

A further possibility is the direct use of the structured portion of the semiconductor element with its three-dimensionally arranged potential maxima as a detector and not as a storage region for chronologically successively recorded charge images. Such a manner of use allows radiations of different penetration depths, corresponding to different frequencies or colors, to be distinguished. Furthermore, the direction of incidence of the radiation can be measured by such an embodiment.

Depending upon whether the structured portion of the semiconductor body is used primarily as a radiation detector or as a storage element, the volume of the grid electrodes relative to the radiation sensitive portion of the base body in the structured portion is made large or small.

Although the invention has been described with reference to specific example embodiments, it will be appreciated, that it is intended to cover all modifications and equivalents within the scope of the appended claims.

What we claim is:

1. A semiconductor element comprising a semiconductor body made of a semiconductor material having a first conductivity, first and second major surfaces, respective first and second surface electrode means arranged on said first and second major surfaces, storage cells formed directly by said semiconductor material in said semiconductor body, and control electrode means arranged inside said semiconductor body at least in one plane essentially parallel to said major surfaces for forming further storage cells also directly by said semiconductor material in said semiconductor body, said surface electrode means and said control electrode means each enabling a CCD charge transfer of charge carriers of at least one conductivity type stored in said storage cells, said charge transfer taking place as a CCD charge carrier transport from one storage cell to another storage cell in planes parallel to said major surfaces and in planes perpendicularly to said major surfaces for moving charge carriers three-dimensionally in the three directions of space, whereby a charge image can be stored in one storage plane while another charge image is being read-out from another storage plane of said semiconductor element.

2. The semiconductor element of claim 1, wherein said control electrode means comprises a plurality of control electrodes arranged on a plurality of adjacent parallel planes, whereby said storage cells form three-dimensionally arranged storage elements and said charge carriers may be transferred from one cell to another in a direction essentially perpendicular to said major surface.

3. The semiconductor element of claim 1, wherein said control electrode means comprise doped regions of a second conductivity.

4. The semiconductor element of claim 1, further comprising an electrically insulating material forming a layer at least partially enclosing said control electrode means.

5. The semiconductor element of claim 1, wherein said control electrode has a grid-shape.

6. The semiconductor element of claim 1, wherein said control electrode means comprise an arrangement of strip electrodes.

7. The semiconductor element of claim 6, further comprising channel stops arranged perpendicularly to the lengthwise extension direction of said strip electrodes.

8. The semiconductor element of claim 6, wherein said strip electrodes have a width that varies along the lengthwise extension direction thereof.

9. The semiconductor element of claim 6, wherein said strip electrodes have a doping that varies along the lengthwise extension direction thereof.

10. The semiconductor element of claim 6, comprising strip electrodes arranged on a plurality of neighboring essentially parallel planes, and wherein lengthwise extensions of strip electrodes in different planes extend in different directions so that said strip electrodes in one plane are not in parallel to strip electrodes in a neighboring plane.

11. The semiconductor element of claim 1, wherein said semiconductor body is inhomogenously doped in a manner such that charge transfer in a direction perpendicular to said major surface defines a preferred direction.

12. The semiconductor element of claim 1, further comprising means for injecting charge carriers into said semiconductor body.

* * * * *